United States Patent
Miki

(10) Patent No.: US 9,608,167 B2
(45) Date of Patent: Mar. 28, 2017

(54) LIGHT EMITTING DEVICE

(71) Applicant: NICHIA CORPORATION, Anan-shi, Tokushima (JP)

(72) Inventor: Yasuhiro Miki, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/338,546

(22) Filed: Jul. 23, 2014

(65) Prior Publication Data

US 2015/0028381 A1    Jan. 29, 2015

(30) Foreign Application Priority Data

Jul. 24, 2013 (JP) ................................. 2013-153799

(51) Int. Cl.
| | | |
|---|---|---|
| H01L 33/40 | (2010.01) | |
| H01L 33/62 | (2010.01) | |
| H01S 5/042 | (2006.01) | |
| H01S 5/022 | (2006.01) | |

(52) U.S. Cl.
CPC ............. *H01L 33/40* (2013.01); *H01L 33/62* (2013.01); *H01L 2224/45139* (2013.01); *H01L 2224/45144* (2013.01); *H01L 2224/48091* (2013.01); *H01L 2224/48465* (2013.01); *H01L 2224/49107* (2013.01); *H01S 5/02276* (2013.01); *H01S 5/0425* (2013.01)

(58) Field of Classification Search
USPC ...................................................... 257/98, 99
See application file for complete search history.

(56) References Cited

U.S. PATENT DOCUMENTS

| | | | |
|---|---|---|---|
| 2001/0042860 | A1* | 11/2001 | Hata ........................ H01L 33/20 257/21 |
| 2005/0179364 | A1 | 8/2005 | Murazaki |
| 2006/0017061 | A1* | 1/2006 | Sakamoto ............... H01L 33/20 257/103 |
| 2006/0202219 | A1 | 9/2006 | Ohashi et al. |
| 2007/0241321 | A1 | 10/2007 | Kuo et al. |
| 2008/0142821 | A1* | 6/2008 | Sakamoto ............. H01L 33/382 257/98 |
| 2008/0210957 | A1* | 9/2008 | Watanabe et al. .............. 257/89 |
| 2008/0293231 | A1 | 11/2008 | Goshonoo et al. |
| 2010/0117070 | A1 | 5/2010 | Adekore et al. |
| 2011/0089401 | A1* | 4/2011 | Hiraiwa et al. ................. 257/13 |

(Continued)

FOREIGN PATENT DOCUMENTS

| | | |
|---|---|---|
| JP | 2002-151737 A | 5/2002 |
| JP | 2005-019646 A | 1/2005 |

(Continued)

OTHER PUBLICATIONS

Office Action dated Oct. 4, 2016 corresponding to Japanese Patent Application No. 2013-153799.

*Primary Examiner* — Bilkis Jahan
(74) *Attorney, Agent, or Firm* — Squire Patton Boggs (US) LLP

(57) ABSTRACT

A light emitting device uses an Ag wire and exhibits excellent light extraction efficiency. In the light emitting device, a pad electrode of a light emitting element and a mount electrode are connected to each other using an Ag wire. The pad electrode contains Pt in a region where the Ag wire is bonded.

7 Claims, 9 Drawing Sheets

(56) References Cited

U.S. PATENT DOCUMENTS

| | | | |
|---|---|---|---|
| 2012/0248458 A1 | 10/2012 | Cho et al. | |
| 2012/0305962 A1* | 12/2012 | Won et al. | 257/98 |
| 2012/0326117 A1* | 12/2012 | Tanaka | H01L 33/38 257/13 |
| 2013/0049055 A1* | 2/2013 | Jeon | 257/98 |
| 2013/0126934 A1 | 5/2013 | Chung et al. | |
| 2013/0256732 A1 | 10/2013 | Miki et al. | |

FOREIGN PATENT DOCUMENTS

| | | |
|---|---|---|
| JP | 2005-317931 A | 11/2005 |
| JP | 2006-253298 A | 9/2006 |
| JP | 2007-080990 A | 3/2007 |
| JP | 2008-135554 A | 6/2008 |
| JP | 2008-244161 A | 10/2008 |
| JP | 2009-054860 A | 3/2009 |
| JP | 2011-151086 A | 8/2011 |
| JP | 3174849 U | 4/2012 |
| JP | 2012-099577 A | 5/2012 |
| JP | 2013-110410 A | 6/2013 |
| WO | WO 03/092081 A1 | 11/2003 |
| WO | WO 2011/055462 A1 | 5/2011 |
| WO | WO 2012/077407 A1 | 6/2012 |

\* cited by examiner

LIGHT EMITTING DEVICE

CROSS-REFERENCE TO RELATED APPLICATIONS

This application claims priority to Japanese Patent Application No. 2013-153799, filed on Jul. 24, 2013. The entire disclosure of Japanese Patent Application No. 2013-153799 is hereby incorporated herein by reference.

BACKGROUND

Field

The present disclosure relates to a light emitting device.

Description of Related Art

There is a known light emitting device in which a pad electrode of a light emitting element and a mount electrode are connected to each other using an Au wire, such as in Japanese Patent Publication No. JP 2009-054860 A.

SUMMARY

A light emitting device in which a pad electrode of a light emitting element and a mount electrode are connected to each other using an Ag wire, wherein the pad electrode contains Pt at a region where the Ag wire is bonded.

BRIEF DESCRIPTION OF THE DRAWINGS

FIG. 2A is a plan view and FIG. 2B is a cross-sectional view taken along A-A in FIG. 2A.

FIG. 3A is a plan view and FIG. 3B is a cross-sectional view taken along A-A in FIG. 3A.

FIG. 4A is a plan view and FIG. 4B is a cross-sectional view taken along A-A in FIG. 4A.

FIG. 5A is a plan view and FIG. 5B is a cross-sectional view taken along A-A in FIG. 5A.

DETAILED DESCRIPTION

Hereinafter, an embodiment will be described with reference to the accompanying drawings.

Figure 1:
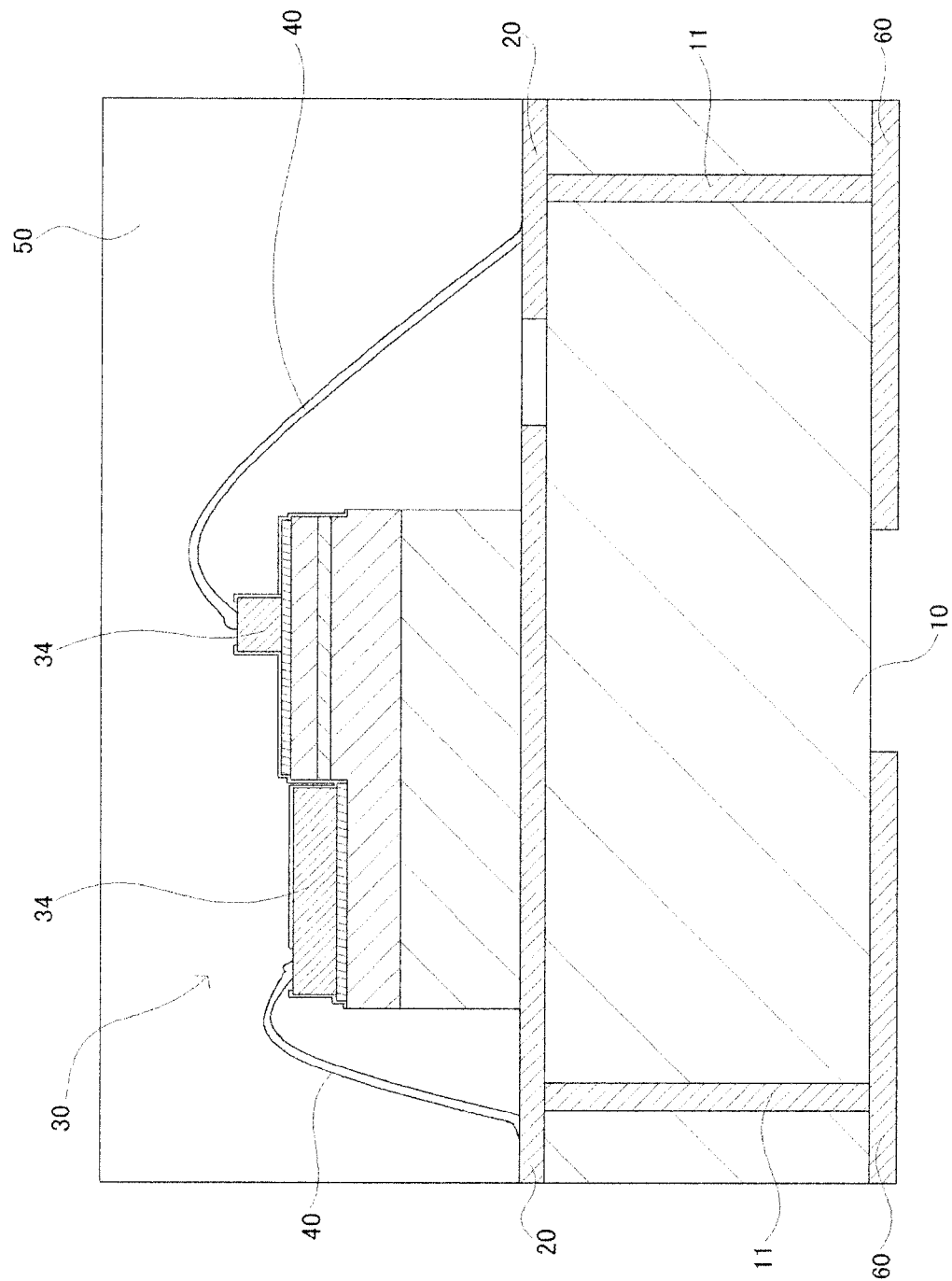
FIG. 1 is a schematic cross-sectional view of a light emitting device according to an embodiment.

FIG. 1 is a schematic cross-sectional view of a light emitting device according to an embodiment.

As shown in FIG. 1, a light emitting device according to an embodiment includes a support substrate 10, a mount electrode 20, a light emitting element 30 provided on the support substrate 10, an Ag wire 40 connecting a pad electrode 34 of the light emitting element 30 and a mount electrode 20 to each other, and a sealing member 50 sealing the light emitting element 30 and the Ag wire 40.

In the following, the constituents are described in order.

The support substrate 10 may be a printed circuit board or a resin package. The resin package may be provided with a recess portion for placing the light emitting element 30 therein.

The mount electrode 20 may be made of a member selected from various conductive members. In the case where Ag is employed for the mount electrode 20, the bonding strength between the mount electrode 20 and the Ag wire 40 can be enhanced.

The mount electrode 20 is provided on the upper surface side of the support substrate 10. In the case where the support substrate 10 is a printed circuit board, a conductive thin film formed on a base material made of glass epoxy or the like can be employed as the mount electrode 20. In this case, the mount electrode 20 provided on the upper surface side of the support substrate 10 may be connected to an external electrode 60 provided on the lower surface side of the support substrate 10 via a through-hole 11 provided to the support substrate 10. Further, in the case where the support substrate 10 is a resin package, a lead frame may serve as the mount electrode 20, for example. In this case, the lead frame can be arranged, for example, from inside the concave portion of the resin package, through the side surface side of the resin package, to the lower surface side of the resin package.

As the Ag wire 40, a wire made of 100% Ag, or a wire mainly made of Ag can be employed. The term "a wire mainly made of Ag" refers to a wire that contains Ag by 50% or more. For example, a wire composed of 88% Ag, 8.5% Pd, and 3.5% Au is an example of the wire mainly made of Ag.

As the sealing member 50, a light transmissive member used in the field of light emitting devices, e.g., epoxy resin, silicone resin, or the like, can be employed. The sealing member 50 may contain a light diffusing member such as $TiO_2$, $SiO_2$, and/or a phosphor member such as a YAG-based phosphor and/or a silicate-based phosphor such as a chlorosilicate phosphor that emits green or yellow light and/or a SCASN-based phosphor such as $(Sr, Ca) AlSiN_3$: Eu and/or a CASN-based phosphor such as $CaAlSiN_3$: Eu that emits red light.

As the light emitting element 30, various semiconductor light emitting elements (e.g., a light emitting diode, a semiconductor laser diode) can be employed. It is particularly preferable to use a light emitting element that emits light in the near-ultraviolet to blue region (e.g., light of a wavelength about 360 nm to about 500 nm) because the Ag wire 40 exhibits high reflectance to the light having an emission peak wavelength in such a wavelength region.

Examples of the light emitting element 30 include, for example, a light emitting element (No. 1), a light emitting element (No. 2), a light emitting element (No. 3), and a light emitting element (No. 4), each of which will be described below.

Figure 2A:
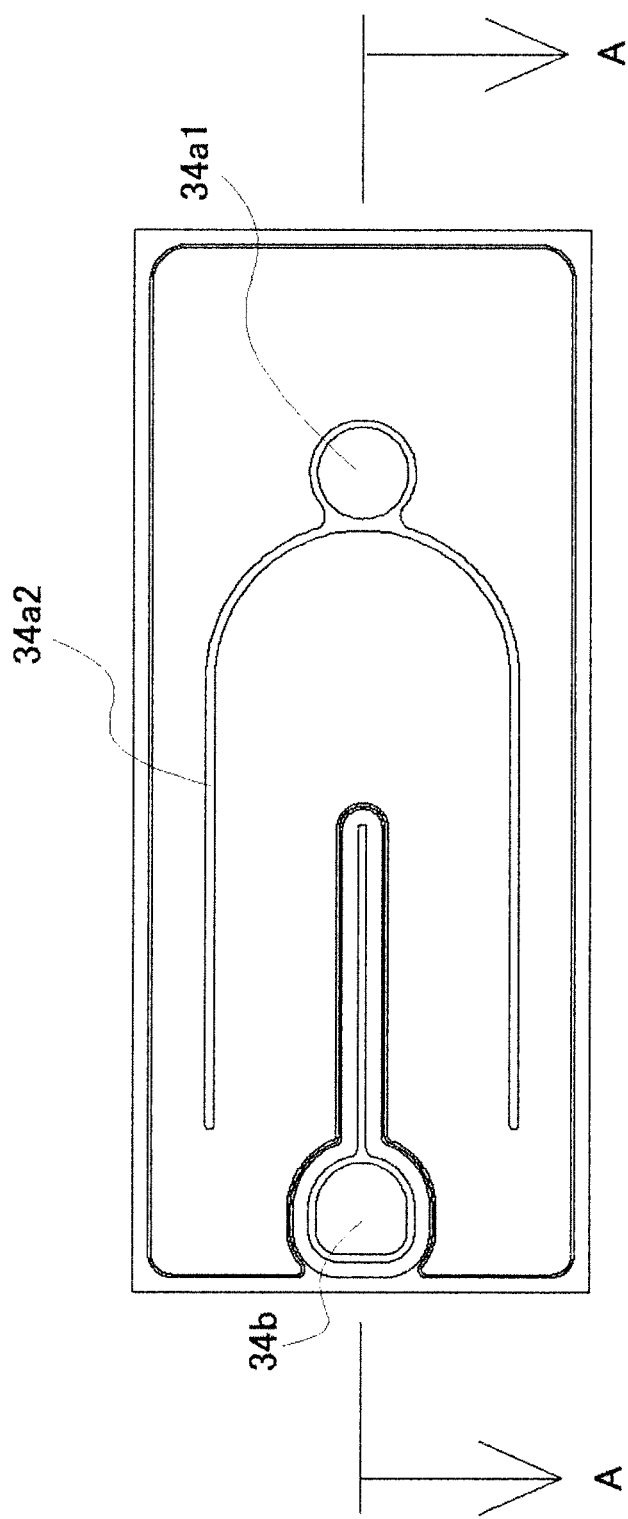
FIGS. 2A and 2B are schematic diagrams of the exemplary light emitting element (No. 1).
Figure 2B:
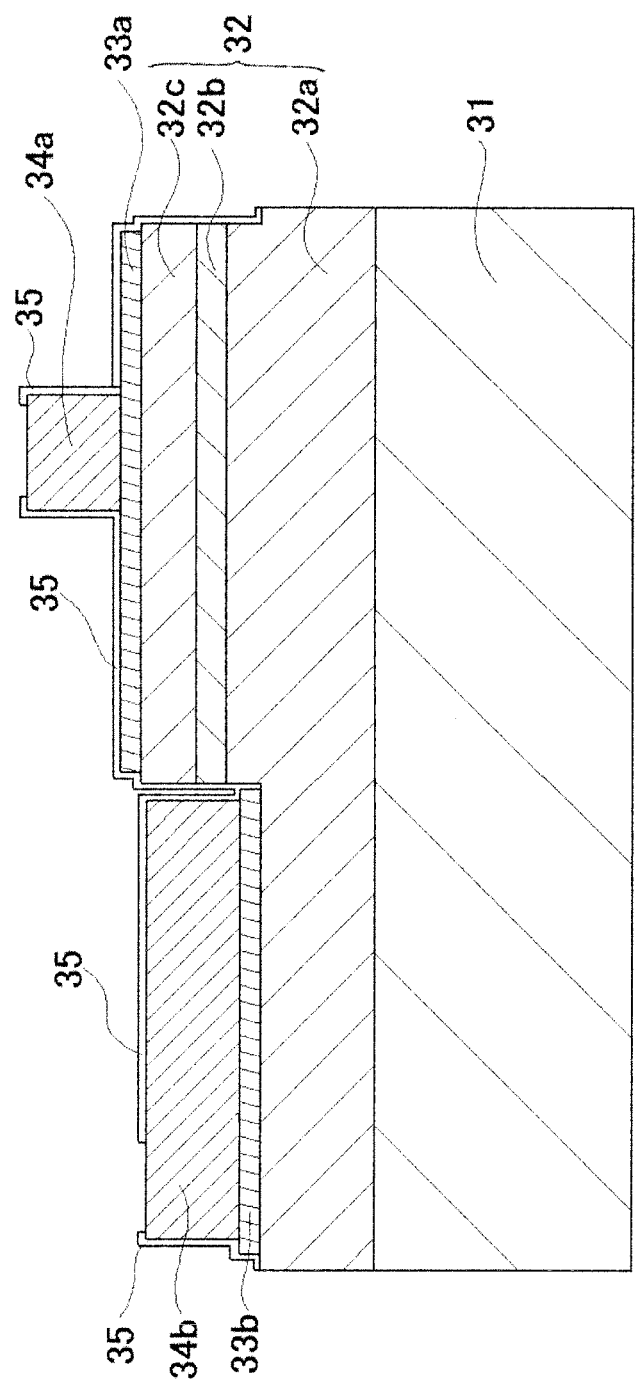

FIGS. 2A and 2B are schematic diagrams of the exemplary light emitting element (No. 1). FIG. 2A is a plan view and FIG. 2B is a cross-sectional view taken along A-A in FIG. 2A.

As shown in FIGS. 2A and 2B, the light emitting element (No. 1) includes a substrate 31, a semiconductor layer 32 formed on the substrate 31, a light transmissive electrode 33 formed on the semiconductor layer 32, a pad electrode 34 formed on the light transmissive electrode 33, and a protective film 35 that covers the semiconductor layer 32 and the light transmissive electrode 33 such that the upper surface of the pad electrode 34 is exposed.

The substrate 31 may be: an insulating substrate such as sapphire or spinel ($MgAl_2O_4$) whose principal surface is any one of C-plane, R-plane, and A-plane; silicon carbide (SiC), ZnS, ZnO, Si, GaAs, or diamond; or an oxide substrate such as lithium niobate or neodymium gallate, which forms a lattice junction with a nitride-based semiconductor.

The semiconductor layer 32 includes an n-type semiconductor layer 32a, an active layer 32b, a p-type semiconductor layer 32c, etc. The n-type semiconductor layer 32a is formed on the substrate 31, the active layer 32b is formed on the n-type semiconductor layer 32a, and the p-type semiconductor layer 32c is formed on the active layer 32b.

The type and material of the n-type semiconductor layer 32a, the active layer 32b, and the p-type semiconductor layer 32c are not particularly limited. For example, various semiconductors such as a III-V compound semiconductor, a II-VI compound semiconductor, and the like can be used. Specifically, for example, a nitride-based semiconductor such as $In_XAl_YGa_{1-X-Y}N$ ($0 \leq X$, $0 \leq Y$, $X+Y \leq 1$) can be used. More specifically, for example, InN, AlN, GaN, InGaN, AlGaN, InGaAlN, and the like can be used. Any thickness and structure known in the field of light emitting devices can be employed for each layer.

The light transmissive electrode 33 includes a p-side light transmissive electrode 33a and an n-side light transmissive electrode 33b. The p-side light transmissive electrode 33a is formed on the p-type semiconductor layer 32c, and the n-side light transmissive electrode 33b is formed on the n-type semiconductor layer 32a.

As the light transmissive electrode 33, ZnO, $In_2O_3$, $SnO_2$, and ITO (Indium Tin Oxide) each being a conductive oxide may be used.

The pad electrode 34 includes a p-side pad electrode 34a and an n-side pad electrode 34b. The p-side pad electrode 34a is formed on the p-side light transmissive electrode 33a, and the n-side pad electrode 34b is formed on the n-side light transmissive electrode 33b. The Ag wire 40 is bonded to the pad electrode 34 (the p-side pad electrode 34a, the n-side pad electrode 34b).

The pad electrode 34 contains Pt at a region where the Ag wire 40 is bonded. Examples of the pad electrode 34 containing Pt at a region where the Ag wire 40 is bonded include a pad electrode made of 100% Pt, a pad electrode containing Pt and a metal other than Pt, and the pad electrodes included in the light emitting elements (No. 2) to (No. 4), which will be described below.

The pad electrode made of 100% Pt is advantageous in that it is bonded to the Ag wire 40 in an excellent manner.

The pad electrode containing Pt and a metal other than Pt is advantageous in the bonding strength with the light transmissive electrode 33 and in the material cost effectiveness. In the pad electrode containing Pt and metal other than Pt, the metal other than Pt may be contained by an amount with which the bonding strength with Ag is not impaired. As the metal other than Pt, at least one metal selected from Ni, Pd, Co, Fe, Ti, Cu, Rh, Au, Ru, W, Zr, Mo, Ta, Ag, Cr, Hf, and the like can be employed as appropriate.

The thickness of the pad electrode 34 is preferably 0.05 µm or more, and more preferably 0.1 µm or more. Thus, even when the pad electrode 34 is deformed by stress (load) that is caused by bonding of the Ag wire 40 being a different material, the base (which is the light transmissive electrode in the embodiments) is not exposed. Accordingly, both the high bonding strength and a high yield can be achieved. Considering the manufacturing time and the material cost, the thickness of the pad electrode 34 is preferably 2 µm or less.

As shown in FIG. 2B, the p-side pad electrode 34a may be shaped to include an external connection portion 34a1 to which the Ag wire 40 is bonded, and an extension portion 34a2 extending from the external connection portion 34a1.

The width of the extension portion 34a2 is preferably 1 µm or more and 20 µm or less, and further preferably 5 µm and more and 10 µm or less. Such a width can reduce the amount of light emitted from the semiconductor layer 32 being blocked by the extension portion 34a2.

As the protective film 35, an insulating material such as $SiO_2$ or SiN can be employed. The extension portion 34a2 of the p-side pad electrode 34a is preferably not covered by the protective film 35. Thus, the light reflected from the protective film 35 will not be absorbed as returning light by the extension portion 34a2. Thus, the light extraction efficiency of the light emitting device improves.

According to the light emitting element (No. 1) described above, the region on the pad electrode 34 bonded to the Ag wire 40 contains Pt. Pt is a material that exhibits excellent bonding strength with Ag, and excellent reflectance as well. Accordingly, with the light emitting element (No. 1), a light emitting device using the Ag wire 40 and exhibiting excellent light extraction efficiency can be provided.

Figure 3A:
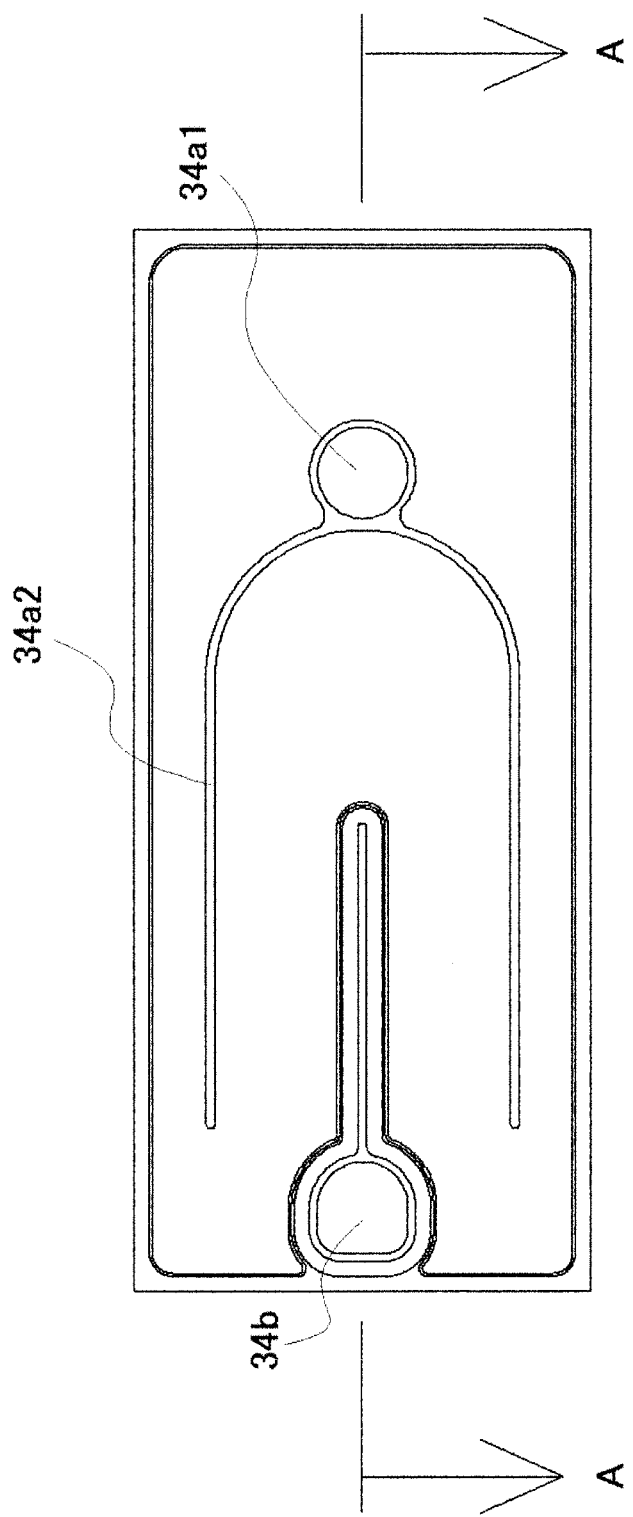
FIGS. 3A and 3B are schematic diagrams of the exemplary light emitting element (No. 2).
Figure 3B:
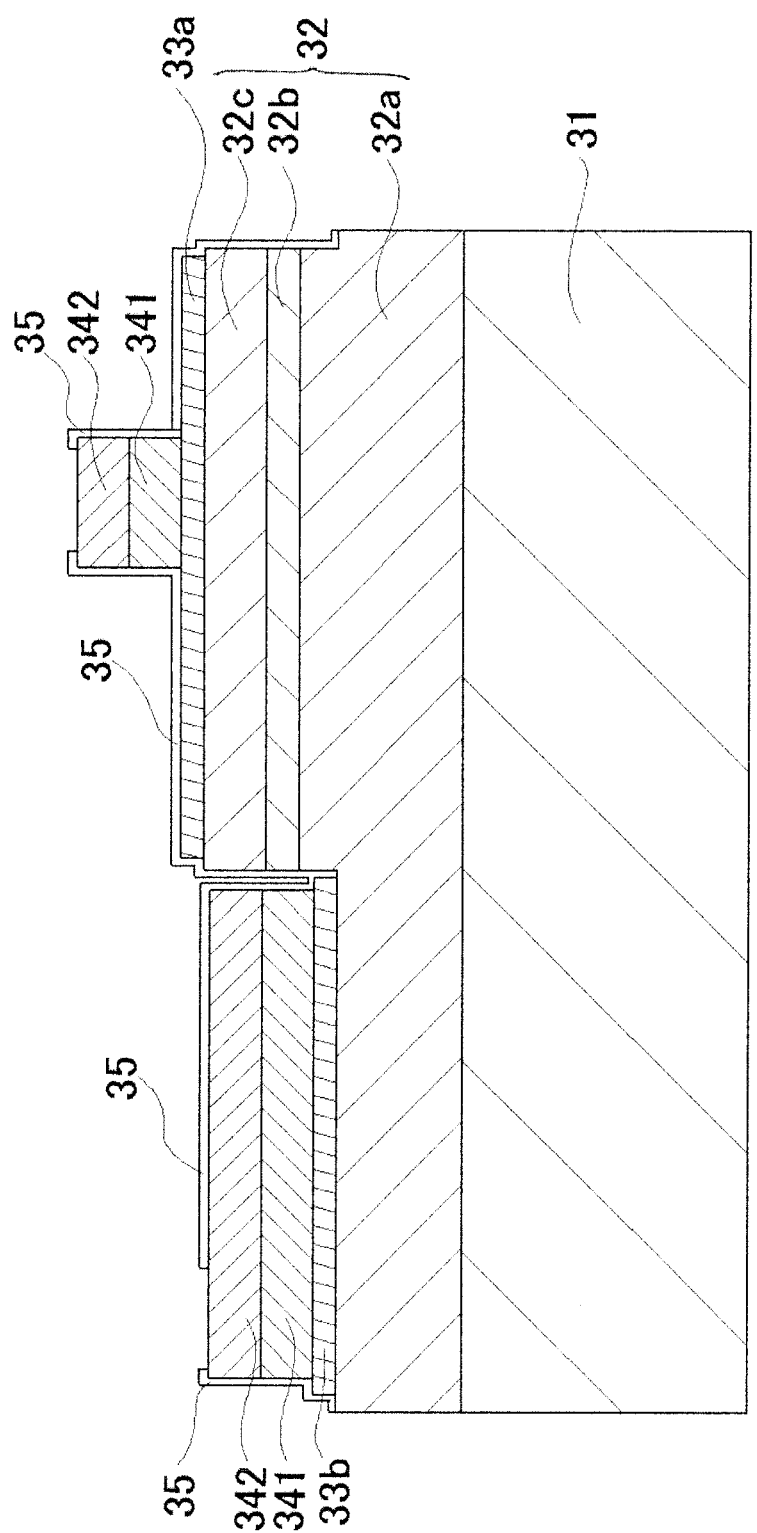

FIGS. 3A and 3B are schematic diagrams of the exemplary light emitting element (No. 2). FIG. 3A is a plan view and FIG. 3B is a cross-sectional view taken along A-A in FIG. 3A.

As shown in FIG. 3, the light emitting element (No. 2) is different from the light emitting element (No. 1) in that the pad electrode 34 (the p-side pad electrode 34a, the n-side pad electrode 34b) includes a first layer 341 and a second layer 342 formed on the first layer 341. In the following, a description will be given focusing on the difference.

The first layer 341 is a layer that contains a metal material having a higher electric conductivity than Pt. Since the first layer 341 can reduce the sheet resistance of the pad electrode 34, it provides the effect of current diffusion and hence is useful. In particular, it is useful in the case where the pad electrode 34 has the extension portion 34a2 (see FIG. 2B).

The metal having higher electric conductivity than Pt may be at least one metal material selected from Au, Ag, Cu, Al, Rh, Mo, and W. The metal material of which the first layer 341 is made may also be Ti. The first layer 341 may contain Pt in addition to such a metal material. Thus, reflectance of the pad electrode 34 can be enhanced, whereby the light extraction efficiency of the light emitting device can be improved.

The thickness of the first layer 341 is preferably about 1 nm to about 5 nm, and more preferably about 1 nm to about 2 nm. Thus, the light from the semiconductor layer 32 transmits through the first layer 341, and the contact resistance between the light transmissive electrode 33 being the base and the first layer 341 is reduced. This facilitates formation of ohmic contact between the semiconductor layer 32 and the pad electrode 34. When the first layer 341 is formed to be so thin that the second layer 342 is partially exposed, Pt contained in the second layer 342 (which will be described below) is diffused into the first layer 341. Accordingly, the contact resistance between the light transmissive electrode 33 and the first layer 341 can be further reduced.

The second layer 342 is a layer that contains Pt. The Ag wire 40 is bonded to the second layer 342.

The thickness of the second layer 342 in the p-side pad electrode 34a (when the extension portion 34a2 is included) is preferably 2.5 µm or more and 5 µm or less. Thus, the sheet resistance of the pad electrode 34 can be further reduced.

Further, the thickness of the second layer 342 in the p-side pad electrode 34a (when the extension portion 34a2 is not included) and the thickness of the second layer 342 in the n-side pad electrode 34b are each preferably 0.05 µm or more, and further preferably 0.1 μm or more. Thus, it becomes possible to prevent the second layer 342 from peeling from the first layer 341 when the Ag wire 40 is bonded to the second layer 342.

In the case where the thickness of the second layer 342 in the p-side pad electrode 34a (when the extension portion 34a2 is not included) and the thickness of the second layer 342 in the n-side pad electrode 34b are each preferably 2 μm or less, and further preferably 1 μm or less. Thus, the manufacturing cost and manufacturing time of the light emitting device can be reduced.

According to the light emitting element (No. 2) described above, the sheet resistance of the pad electrode 34 can be reduced by the second layer 342 in the light emitting device using the Ag wire 40 and exhibiting excellent light extraction efficiency. Accordingly, the current flowing from the Ag wire 40 can be easily diffused into the entire semiconductor layer 32.

Figure 4A:
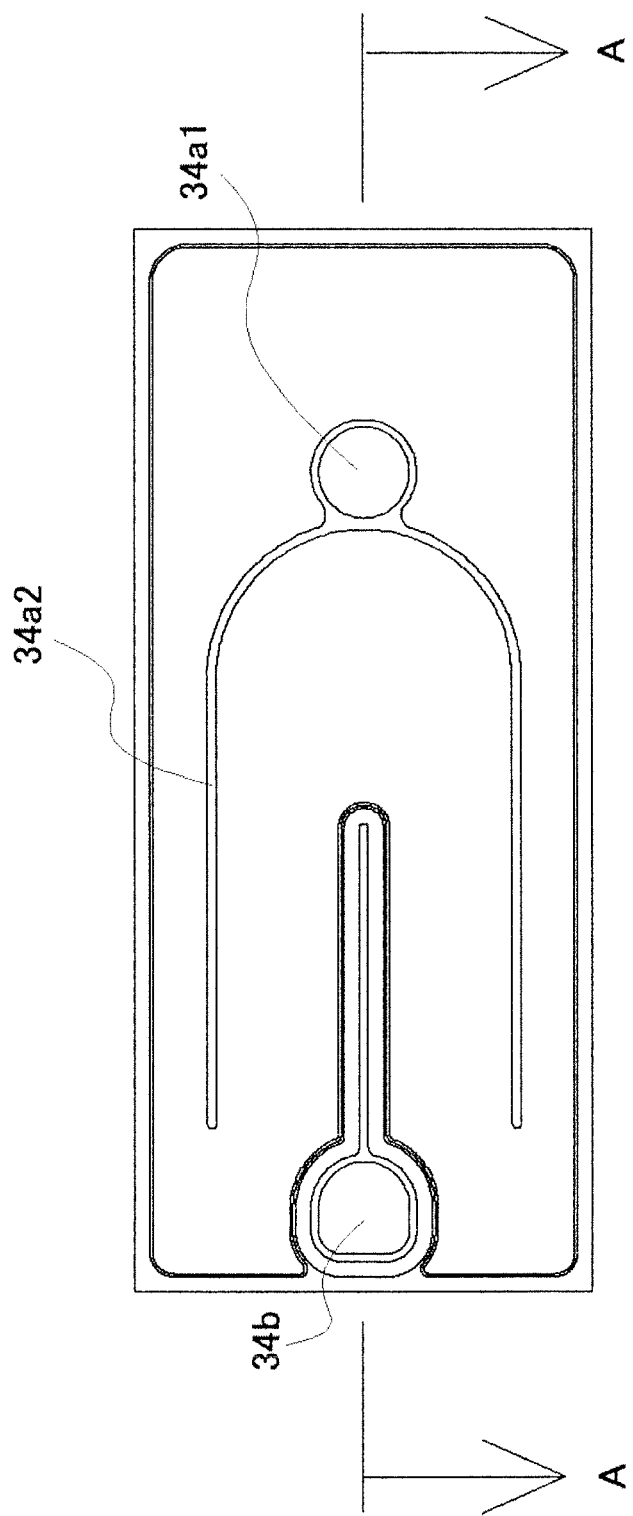
FIGS. 4A and 4B are schematic diagrams of the exemplary light emitting element (No. 3).
Figure 4B:
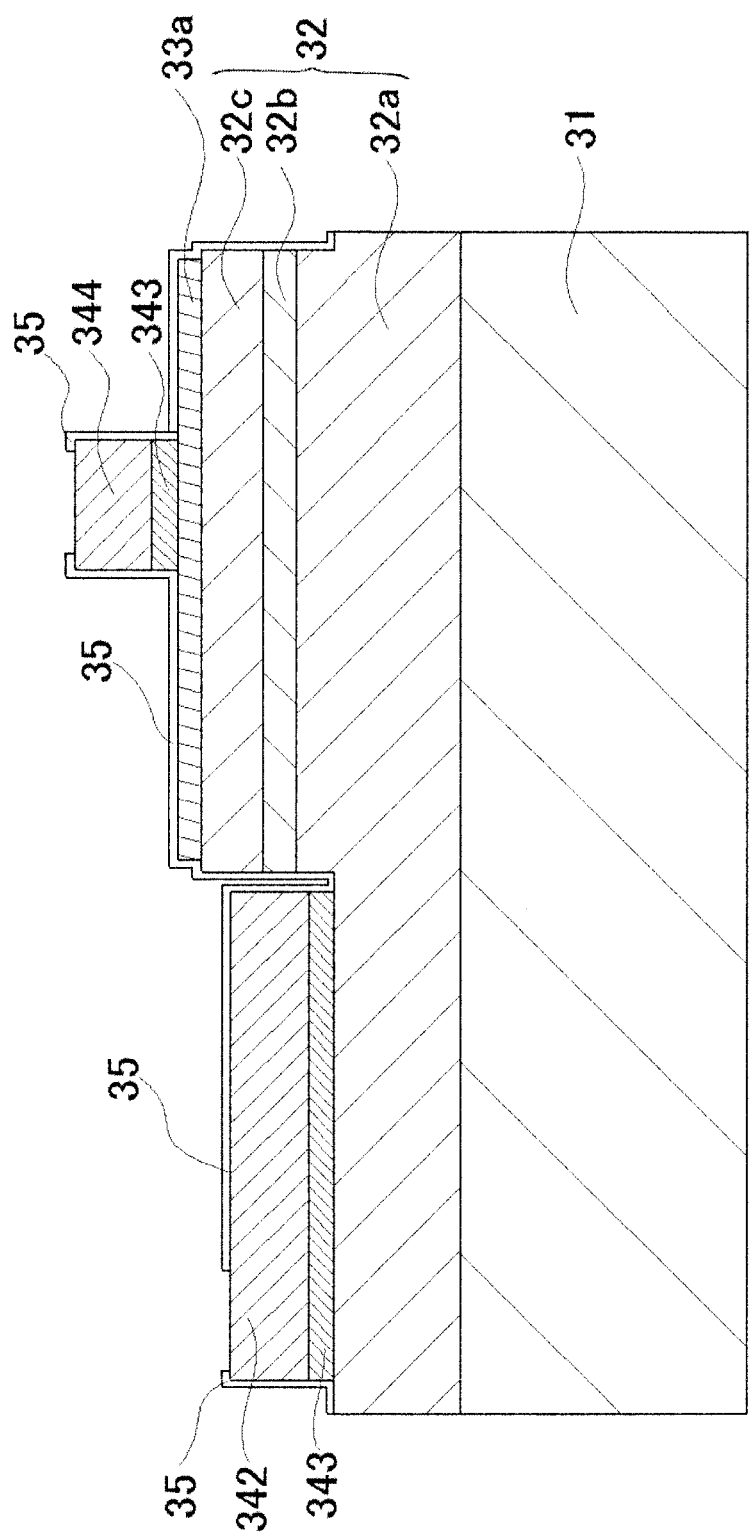

FIGS. 4A and 4B are schematic diagrams of the exemplary light emitting element (No. 3). FIG. 4A is a plan view and FIG. 4B is a cross-sectional view taken along A-A in FIG. 4A.

As shown in FIG. 4, the light emitting element (No. 3) is different from the light emitting element (No. 1) in that the pad electrode 34 (the p-side pad electrode 34a, the n-side pad electrode 34b) includes a first layer 343 and a second layer 344 formed on the first layer 343, and that no light transmissive electrode 33b is provided between the n-side pad electrode 34b and the n-type semiconductor layer 32a. In the following, the description will be given focusing on the differences.

The first layer 343 may be a layer made of 100% Cr, a layer mainly made of Cr, or a layer mainly made of Rh and contains Cr.

The term "a layer mainly made of Cr" refers to a layer that contains Cr by 50% or more. For example, a layer composed of 90% Cr and 10% Pt is an example of the layer mainly made of Cr. With the layer made of 100% Cr or the layer mainly made of Cr, the bonding strength between the pad electrode 34 and the light transmissive electrode 33 can be enhanced.

Further, the layer mainly made of Rh and contains Cr refers to a layer that contains Rh by 50% or more and contains Cr. For example, a layer composed of 5% Cr and 95% Rh is an example of the layer mainly made of Rh and contains Cr. With the layer mainly made of Rh and contains Cr, it becomes possible to bond the Ag wire 40 with the pad electrode 34 which has good reflectivity, while enhancing the bonding strength between the pad electrode 34 and the light transmissive electrode 33 by Cr.

The thickness of the first layer 343 is preferably about 1 nm to about 50 nm, and further preferably about 1 nm to about 10 nm. Thus, the bonding strength between the light transmissive electrode 33 and the pad electrode 34 can be enhanced.

However, taking into consideration variations in thickness that may occur during manufacture, the first layer 343 is preferably manufactured with an intended thickness of about 3.0 nm.

Further, in the case where the light transmissive electrode 33 is provided between the p-side pad electrode 34a and the p-type semiconductor layer 32c as in the embodiments, taking into consideration a reduction in the contact resistance between the p-side pad electrode 34a and the light transmissive electrode 33, the thickness of the first layer 343 in the p-side pad electrode 34a is preferably less than 9 nm, more preferably 6 nm or less, and further preferably 4.5 nm or less. Further, taking into consideration a reduction in the contact resistance between the n-side pad electrode 34b and the n-type semiconductor layer 32a, the thickness of the first layer 343 in the n-side pad electrode 34b is preferably 1 nm or more, and more preferably 1.5 nm or more.

The second layer 344 is a layer that contains Pt. The Ag wire 40 is bonded to the second layer 344.

The second layer 344 is preferably formed so as not to be thinner than the first layer 343, in order for Pt to be fully diffused into the first layer 343. For example, the thickness of the second layer 344 is preferably at least as great as the thickness of the first layer 343, and more preferably at least five times greater than that. Specifically, the thickness of the second layer 344 is preferably 10 nm or more, also from the viewpoint of controllability of the second layer 344 during manufacture. A further improvement in the effect cannot be expected by an increase in the thickness of the second layer 344 to be over 100 nm, and instead, the yield will be reduced. Accordingly, the second layer 344 is preferably 100 nm or less.

It is preferable that a Cr—Pt alloy layer is formed around the interface between the first layer 343 and the second layer 344 as a result of diffusion of Pt from the second layer 344 into the first layer 343. Thus, the first layer 343 and the second layer 344 are closely adhered to each other to be integrated, and hence the bonding strength between the pad electrode 34 and the light transmissive electrode 33 improves.

In order for Pt to diffuse from the second layer 344 into the first layer 343, the pad electrode 34 is preferably subjected to heat treatment after the first layer 343, the second layer 344, and other metal layers are deposited.

According to the light emitting element (No. 3) described above, the contact resistance of the pad electrode 34 can be reduced in the light emitting device using the Ag wire 40 and exhibiting excellent light extraction efficiency.

Figure 5A:
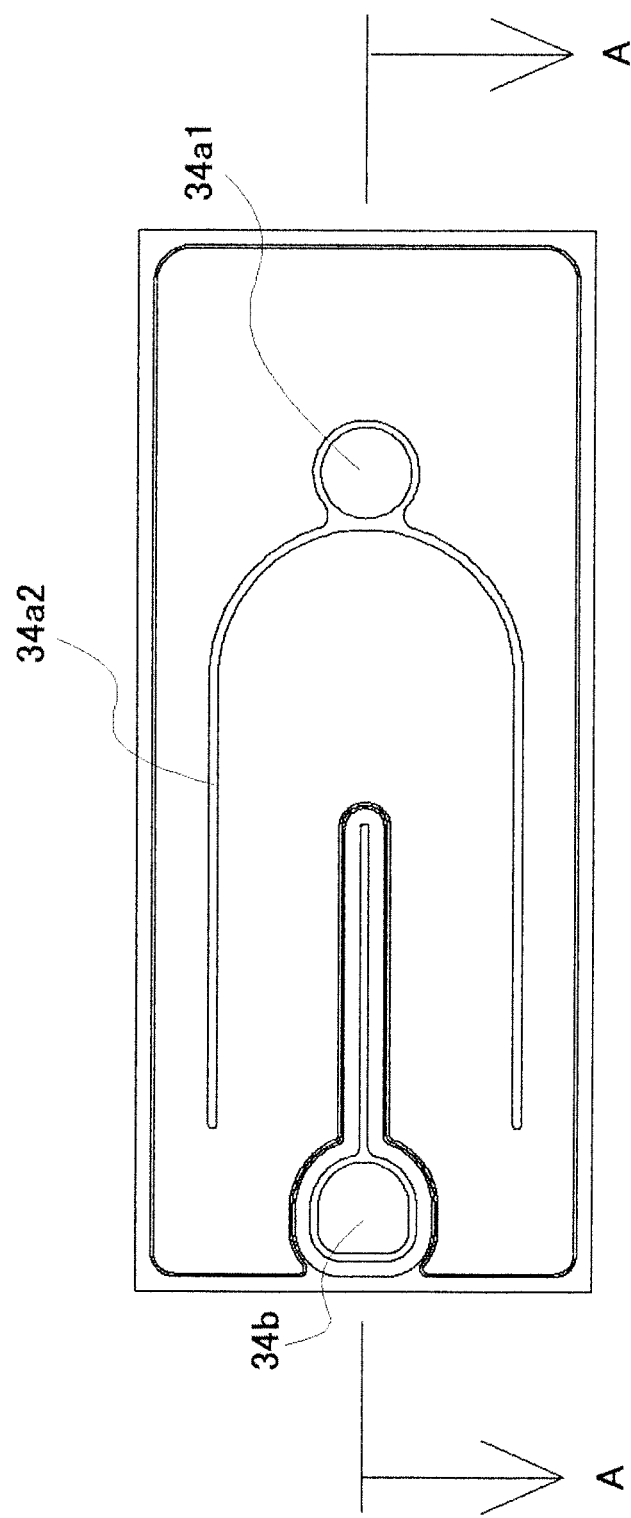
FIGS. 5A and 5B are schematic diagrams of the exemplary light emitting element (No. 4).
Figure 5B:
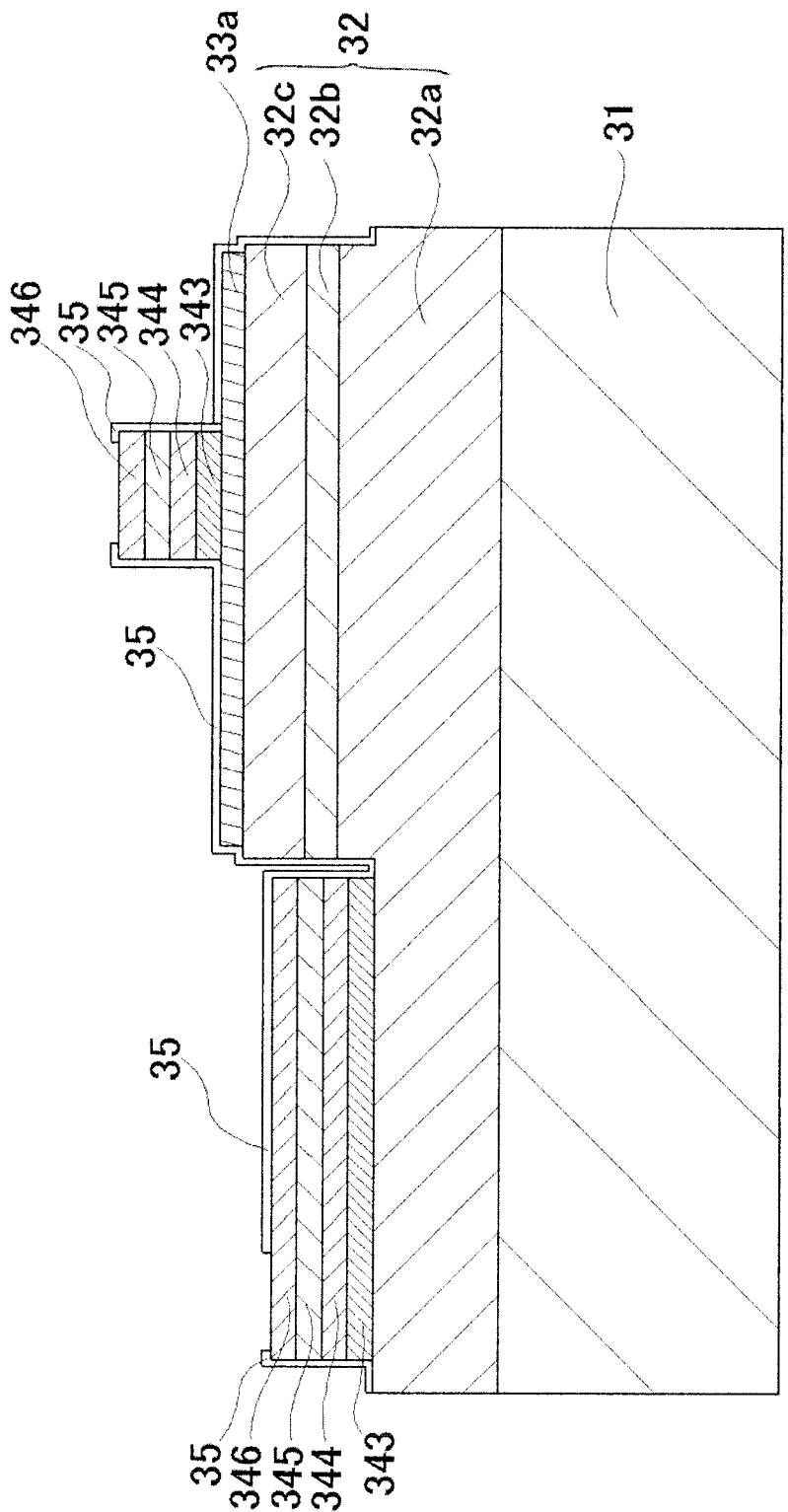

FIGS. 5A and 5B are schematic diagrams of the exemplary light emitting element (No. 4). FIG. 5A is a plan view and FIG. 5B is a cross-sectional view taken along A-A in FIG. 5A.

As shown in FIG. 5, the light emitting element (No. 4) is different from the light emitting element (No. 3) in that the pad electrode 34 (the p-side pad electrode 34a, the n-side pad electrode 34b) includes a third layer 345 formed on the second layer 344 in the light emitting element (No. 3), and a fourth layer 346 formed on the third layer 345. In the light emitting element (No. 4), the second layer 344 functions to enhance the bonding strength between the pad electrode 34 and the light transmissive electrode 33 similarly to the light emitting element (No. 3), and to suppress the third layer 345 from diffusing into the first layer 343.

The third layer 345 may be a layer made of 100% Au, or may be a layer mainly made of Au. The term "a layer mainly made of Au" refers to a layer that contains Au by 50% or more, and that contains a material having higher electric conductivity than Pt. The material having higher electric conductivity than Pt may be Cu, Al, Ag, Au, Rh, Mo, W, or the like.

The thickness of the third layer 345 is preferably 0.1 μm to 1 μm. In particular, with the thickness of about 1 μm, an increase in drive voltage Vf of the light emitting device can be suppressed.

The third layer 345 is a layer that contains a metal material having higher electric conductivity than Pt. Since the third layer 345 can reduce the sheet resistance of the pad electrode 34, it provides the effect of current diffusion and hence is useful. In particular, the third layer 345 is useful in the case where the p-side pad electrode 34a has the extension portion 34a2 (see FIG. 2B).

The fourth layer 346 may be a layer made of 100% Pt, or a layer mainly made of Pt. The layer mainly made of Pt refers to a layer that contains Pt by 50% or more.

The thickness of the fourth layer 346 is preferably 0.05 μm to 1 μm, and more preferably 0.1 μm to 0.5 μm. Thus, it becomes possible to prevent the fourth layer 346 from peeling from the third layer 345 when the Ag wire 40 is bonded to the fourth layer 346.

According to the light emitting element (No. 4) described above, the contact resistance of the pad electrode 34 can be reduced in the light emitting device using the Ag wire 40 and exhibiting excellent light extraction efficiency. Further, the sheet resistance of the pad electrode 34 can be reduced by the third layer 345. Accordingly, the current flowing from the Ag wire 40 can be easily diffused into the entire semiconductor layer 32. Therefore, with the light emitting element (No. 4), the pad electrode 34 can be made thinner than that in the light emitting element (No. 3) while conductivity equivalent to that of the light emitting element (No. 3) is secured. Thus, productivity of the light emitting device can be improved.

Four wafers having pad electrodes of different materials were prepared, to check the bonding state between each pad electrode and the Ag wire. The pad electrodes each had five layers, and the Ag wire was bonded to the surface of the fifth layer. In Table 1, in the fields under "Success/Failure of Bonding", "O" represents "Bonded" and "X" represents "Not Bonded".

TABLE 1

| Pad Electrode (First Layer/Second Layer/Third Layer/Fourth Layer/Fifth Layer) | Success/Failure of Bonding |
| --- | --- |
| 1 Ti/Rh/W/Au (0.5 μm)/Pt (0.5 μm) | O |
| 2 Ti/Rh/W/Au (0.5 μm)/Rh (0.5 μm) | X |
| 3 Ti/Rh/W/Au (0.5 μm)/Ru (0.5 μm) | X |
| 4 Ti/Rh/W/Au (0.5 μm)/Ir (0.5 μm) | X |

As shown in Table 1, in the case where the region bonded to the Ag wire contained Pt, the Ag wire could be bonded to the pad electrode. In the case where the region bonded to the Ag wire did not contain Pt, the Ag wire could not be bonded to the pad electrode. Accordingly, it can be seen that, in the case where the region bonded to the Ag wire contains Pt, the bonding strength between the Ag wire and the pad electrode is enhanced.

In the foregoing, while the description has been given of the embodiment, such a description relates to an example. The present invention is not limited by the description.

REFERENCE MARKS IN THE DRAWINGS

10 support substrate
11 through-hole
20 mount electrode
30 light emitting element
31 substrate
32 semiconductor layer
32a n-type semiconductor layer
32b active layer
32c p-type semiconductor layer
33 light transmissive electrode
33a p-side light transmissive electrode
33b n-side light transmissive electrode
34 pad electrode
341 first layer
342 second layer
343 first layer
344 second layer
345 third layer
346 fourth layer
34a p-side pad electrode
34a1 external connection portion
34a2 extension portion
34b n-side pad electrode
35 protective film
40 Ag wire
50 sealing member
60 external electrode

What is claimed is:

1. A light emitting device, comprising:
   a pad electrode formed on a light transmissive electrode of a light emitting element provided above a support substrate; and
   a mount electrode provided on an upper surface of the support substrate and connected to the pad electrode using an Ag wire, wherein the pad electrode comprises Pt at a region where the Ag wire is bonded,
   wherein the pad electrode includes an external connection portion and an extension portion that extends from the external connection portion, wherein the extension portion has a width that is narrower than the external connection portion, wherein the extension portion is in physical contact with the light transmissive electrode, wherein the Ag wire is bonded to the external connection portion, and wherein the external connection portion comprises the Pt.

2. The light emitting device according to claim 1, wherein the pad electrode comprises:
   a first layer that comprises either 100% Cr, mainly made of Cr, or mainly made of Rh and contains Cr; and
   a second layer that is disposed on the first layer and contains Pt, and
   wherein the Ag wire is bonded to the second layer of the pad electrode.

3. The light emitting device according to claim 1, wherein the pad electrode comprises:
   a first layer that comprises either 100% Cr, mainly made of Cr, or mainly made of Rh and contains Cr;
   a second layer that is disposed on the first layer and contains Pt;
   a third layer that comprises 100% Au or mainly made of Au, the third layer being disposed on the second layer; and
   a fourth layer that comprises 100% Pt or is mainly made of Pt, the fourth layer being disposed on the third layer, and
   wherein the Ag wire is bonded to the fourth layer of the pad electrode.

4. The light emitting device according to claim 1, wherein the light emitting element is provided on the support substrate.

5. The light emitting device according to claim 1, wherein an entire length of the extension portion is in physical contact with the light transmissive electrode.

6. The light emitting device according to claim 1, wherein the pad electrode comprises:
   a first layer that contains a metal material having higher electric conductivity than Pt; and a second layer that is disposed on the first layer and contains Pt, and wherein the Ag wire is bonded to the second layer of the pad electrode.

7. The light emitting device according to claim 6, wherein the first layer contains at least one metal material selected from Au, Ag, Cu, Al, Rh, Mo, and W.

* * * * *